(12) United States Patent
Zhang

(10) Patent No.: US 11,448,469 B2
(45) Date of Patent: Sep. 20, 2022

(54) HEAT-WING

(71) Applicant: Yue Zhang, Shanghai (CN)

(72) Inventor: Yue Zhang, Shanghai (CN)

( * ) Notice: Subject to any disclaimer, the term of this patent is extended or adjusted under 35 U.S.C. 154(b) by 0 days.

(21) Appl. No.: 15/980,557

(22) Filed: May 15, 2018

(65) Prior Publication Data

US 2019/0353429 A1 Nov. 21, 2019

Related U.S. Application Data

(63) Continuation-in-part of application No. 14/335,649, filed on Jul. 18, 2014, now abandoned.

(51) Int. Cl.
*F28D 15/02* (2006.01)
*F28D 15/04* (2006.01)

(52) U.S. Cl.
CPC ......... *F28D 15/0233* (2013.01); *F28D 15/04* (2013.01)

(58) Field of Classification Search
CPC .. F28D 15/0233; F28D 15/04; F28D 15/0241; F28D 15/0275; F28D 15/02
USPC ............................................ 165/80.4, 104.26
See application file for complete search history.

(56) References Cited

U.S. PATENT DOCUMENTS

| | | | | |
|---|---|---|---|---|
| 5,216,580 A * | 6/1993 | Davidson | ............ | F28D 15/0266 165/104.33 |
| 5,379,830 A * | 1/1995 | Itoh | ..................... | F28D 15/0233 165/104.14 |
| 6,062,302 A * | 5/2000 | Davis | ..................... | F28D 15/02 165/104.26 |
| 6,237,223 B1 * | 5/2001 | McCullough | ........... | B23P 15/26 257/E23.089 |
| 6,253,836 B1 * | 7/2001 | Mitchell | ............. | F28D 15/0233 165/104.33 |
| 7,589,972 B2 * | 9/2009 | Ma | ........................... | H01R 4/48 165/104.26 |
| 7,619,888 B2 * | 11/2009 | Yu | ........................ | F28D 15/0233 165/104.33 |
| 7,626,821 B1 * | 12/2009 | Buffington | ................ | G06F 1/20 165/104.26 |
| 8,011,361 B2 * | 9/2011 | Meyer, IV | .......... | F28D 15/0233 126/689 |

(Continued)

FOREIGN PATENT DOCUMENTS

CN 2567541 Y 8/2003
CN 2665927-X 12/2004
(Continued)

*Primary Examiner* — Tho V Duong
*Assistant Examiner* — Raheena R Malik
(74) *Attorney, Agent, or Firm* — Booth Udall Fuller, PLC

(57) ABSTRACT

A heat-wing includes: a sealed hollow chamber including two plates and a frame connecting the two plates; a capillary structure layer closely attached to an inner surface of the chamber; and a phase transition working medium sealed in the chamber. A portion of the frame or a portion of a periphery of one of the two plates serves as an evaporation area of the heat-wing, and the rest portion of the chamber serves as a condensation area of the heat-wing. The heat-wing has an increased vapor passage area, liquid working medium flow-back passage width and condenser heat transfer area and a reduced evaporator center-to-edge distance, and is hence capable of achieving a great improvement in heat transfer limit and heat flux density.

17 Claims, 18 Drawing Sheets

(56) References Cited

U.S. PATENT DOCUMENTS

| | | | | |
|---|---|---|---|---|
| 8,339,786 B2* | 12/2012 | Cheng | ................... | H01L 23/427 |
| | | | | 165/104.14 |
| 9,721,869 B2* | 8/2017 | Sun | ..................... | F28D 15/0233 |
| 2002/0092166 A1 | 7/2002 | Jacobs et al. | | |
| 2002/0185263 A1* | 12/2002 | Wagner | ............... | F28D 15/0233 |
| | | | | 165/104.33 |
| 2004/0100771 A1* | 5/2004 | Luo | ....................... | H01L 23/427 |
| | | | | 361/700 |
| 2009/0056912 A1* | 3/2009 | Kerber | ................. | F28D 9/0062 |
| | | | | 165/104.13 |
| 2010/0252238 A1 | 10/2010 | Batty et al. | | |
| 2015/0219401 A1* | 8/2015 | Zhang | ................... | F28D 15/046 |
| | | | | 165/104.26 |

FOREIGN PATENT DOCUMENTS

| | | |
|---|---|---|
| CN | 2762507 Y | 3/2006 |
| CN | 201212665 Y | 3/2009 |
| CN | 201364059 Y | 12/2009 |
| CN | 201364095 Y | 12/2009 |
| CN | 201488619 U | 5/2010 |
| CN | 202452869 U | 9/2012 |
| CN | 103217036 A | 7/2013 |

\* cited by examiner

HEAT-WING

TECHNICAL FIELD

The present invention relates generally to phase-change heat radiators, and particularly to a heat-wing and use thereof.

BACKGROUND

Compared to high thermal conductivity solid metal blocks, phase-change heat radiators have higher equivalent thermal conductivities and better heat dissipation performance. They are widely used because of a variety of advantages, such as a high thermal conductivity and good temperature uniformity. These advantages are realized by liquid working media sealed in the heat radiators, on the phase transition of which the heat radiators rely for heat transfer. Currently, heat pipes and vapor chambers are two types of commonly used phase-change heat radiators.

Referring to FIG. 1, a typical heat pipe is composed of a hollow cylindrical chamber 11, a capillary structure 12 and a phase transition working medium 13 hermetically sealed in the chamber. Fabrication of the heat pipe generally includes: vacuuming the chamber and partially filling the chamber with the working medium 13; impregnating the capillary structure 12, which is closely attached to an inner surface of the chamber 11, with the working medium 13; and sealing the chamber. One end of the heat pipe serves as an evaporation area 14 which is brought in contact with a heat source for extracting heat from the source, while the other end acts as a condensation area 15 for dissipating heat, directly, or with the aid of auxiliary equipment such as fans for a higher efficiency. The rest section of the heat pipe between the evaporator and condensation areas 14 and 15 is referred to as an adiabatic section. When the evaporation area 14 is being heated, the working liquid medium 13 in the capillary structure 12 vaporizes into a vapor working medium 16. The vapor working medium subsequently flows through ducts 17 under the action of a differential pressure and enters the condensation area 15, where it condenses back to the liquid working medium 13, releasing the heat. Thereafter, the restored liquid working medium 13 flows along the capillary structure 12 under a capillary pressure and returns to the evaporation area 14. With the repetition of this cycle, heat 18 is continuously transferred from the evaporation area 14 to the condensation area 15 and thereby realizes heat dissipation. However, as the heat pipe has a relatively small diameter, the vapor transport occurs therein in a nearly one-dimensional, linear manner. Moreover, limited by the narrow ducts for vapor transport and a minimal flow-back passage width of the liquid working medium, the heat pipe tends to reach its heat transfer limit before operating at the optimal performance level.

As an improved type of heat pipe, Chinese patent publication No. CN201364059Y discloses a vapor chamber, or called a flat plate heat pipe. As shown in FIG. 2, each of the vapor chambers 42 and 42' uses its two plates to serve as working plates. In the vapor chamber, vapor is transported in a nearly two-dimensional, planar manner. Compared with heat pipe, the vapor chamber provides a larger vapor passage area and a larger liquid working medium flow-back passage width, thus ensuring better temperature uniformity than that of a heat pipe. However, during use of this kind of vapor chambers 42 and 42', heat is transferred successively through a heat conduction piece 41 and clamps 412 for fixing the vapor chambers which are arranged in a direction perpendicular to the plane of the heat source and finally reaches the plates of the vapor chambers 42 and 42'. In such a configuration, the distance from the heat source to the vapor chambers is too long, with an average distance equal to a thickness of the heat conduction piece 41 plus half of a height of the clamp, while a total heat conduction width in the clamps 412 is too short, which is only a sum of the widths of the two clamps 412, thereby results in a relatively high thermal resistance.

Therefore, there exists a need for a novel phase-change heat radiator with a large vapor passage area, large working medium flow-back passage width and short evaporator center-to-edge distance.

SUMMARY OF THE INVENTION

It is therefore an objective of the present invention to provide a phase-change heat radiator with a large vapor passage area, large working medium flow-back passage width, short evaporator center-to-edge distance, large condenser heat dissipation area and high heat transfer limit.

In pursuit of the above objective, a first aspect of the present invention provides a heat-wing, which includes: a sealed hollow chamber, including two plates and a frame connecting the two plates; a capillary structure layer closely attached to an inner surface of the chamber; and a phase transition working medium sealed in the chamber.

Wherein, a portion of the frame or a portion of a periphery of one of the two plates is in direct contact with a heat source and thereby serves as an evaporation area of the heat-wing, and the rest portion of the chamber that is not in contact with the heat source serves as a condensation area of the heat-wing.

Wherein, each of a length and a width of the chamber is much greater than a thickness of the chamber.

In one or more preferred embodiments, materials that the chamber can be fabricated from include copper, aluminum, stainless steel metal and alloys thereof, high thermal conductivity ceramics, and other high thermal conductivity materials.

In one or more preferred embodiments, the capillary structure layer may be a single- or multi-layer structure made of sintered powder(s), wire lattices, grooves etched into the chamber, fibers, coated or grown carbon nanowalls, carbon nanotubes or carbon nanocapsules, other coated or grown nan- or micro-order thin organic or inorganic layer(s), or any combination of the above, or any other suitable structure providing capillary attraction.

In one or more preferred embodiments, materials that may be used as the phase transition working medium include water and other liquids, low melting point metals, carbon nanocapsules, other nanoparticles, mixtures of the above materials, and other materials having gas-liquid phase transition at a temperature within the operating temperature range of the heat-wing.

In one or more preferred embodiments, the two plates are parallel or substantially parallel to each other.

In one or more preferred embodiments, each of the plates may assume a rectangular shape or any other shape, and may be flat or curved.

In one or more preferred embodiments, the heat-wing has a cross-sectional area of a section near to the evaporation area that is larger than a cross-sectional area of an upper section of the heat-wing. Alternatively, the cross-sectional area of the section near to the evaporation area may also be smaller than or equal to the cross-sectional area of the top section.

In one or more embodiments, the heat-wing may be evacuated to a certain degree of vacuum, and may accordingly further include a support or connection structure disposed between the two plates according to the mechanical strength of the chamber and positive and negative pressures to be applied thereto.

In one or more embodiments, the support or connection structure may assume the shape of a dot, a line or a sheet.

In one or more embodiments, the heat-wing may further include a fin.

In one or more embodiments, the heat-wing and/or the fin may be coated with a black-body radiator material.

In one or more embodiments, the heat-wing may further include a hose for vacuuming and liquid filling.

In one or more embodiments, an array of the heat-wings may be disposed on a heat source. Another aspect of the present invention provides an apparatus which includes a heat-generating component and at least one heat-wing each including: a sealed hollow chamber including two plates and a frame connecting the two plates; a capillary structure layer closely attached to an inner surface of the chamber; and a phase transition working medium sealed in the chamber, wherein each heat-wing has a portion of the frame or a portion of a periphery of one of the two plates thereof in direct contact with the heat-generating component and thereby serving as an evaporation area of the heat-wing, and the rest portion of the chamber that is not in contact with the heat-generating component serves as a condensation area of the heat-wing, wherein each of a length and a width of the chamber of each heat-wing is much greater than a thickness thereof.

Compared with the conventional, the present invention has the following advantages: as the heat-wing of the present invention is a hermetically sealed plate-shaped hollow chamber having a length and width both much greater than its thickness, by bringing a portion of a periphery of one of the two plates or a portion of the frame, which has a limited area relative to the whole chamber area, into contact with the surface of the heat source so as to make it serve as an evaporation area, vapor is transported in a nearly two-dimensional, planar manner in the heat-wing, which results in a large passage area for vapor transport and ensures a high temperature uniformity; since the gap between the two plates is very small, a very short evaporation area center-to-edge distance can be achieved, thereby addressing the issue of early dry-out of the evaporation area central area; by using the two relatively large plates as a condensation area, the heat-wing ensures an extremely large condensation area which facilitates the heat dissipation, and provides a large working medium flow-back passage width which is about two times the width of the heat-wing and allows a large flux of the working medium.

The heat-wing has a greatly improved heat transfer limit and is hence capable of achieving a higher heat flux density over the conventional.

DETAILED DESCRIPTION

The forgoing objectives, features and advantages of the present invention will become apparent from the following detailed description of illustrative embodiments thereof, which is to be read in connection with the accompanying drawings. It is to be understood that the invention is not limited to the embodiments described herein and the embodiments are provided to enable those skilled in the art to understand the present invention. In addition, the technical terms used herein could be construed in the broadest sense without departing from the spirit and nature of the invention. The use of the same reference symbols in different drawings indicates similar or identical items.

Figure 3:
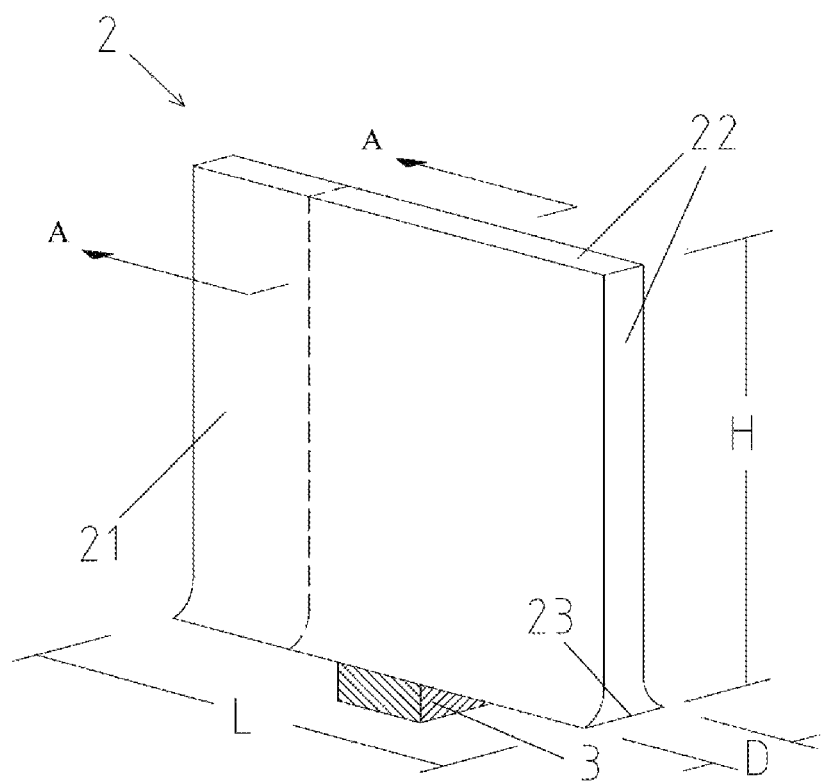
FIG. 3 shows a three-dimensional view of a heat-wing in accordance with a first embodiment of the present invention.
Figure 4:
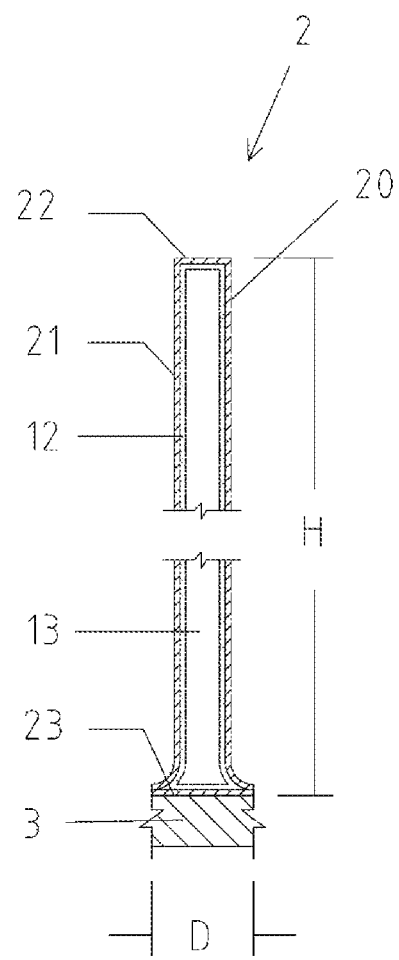
FIG. 4 shows a schematic cross-sectional view taken along the line A-A of FIG. 3.
Figure 5:
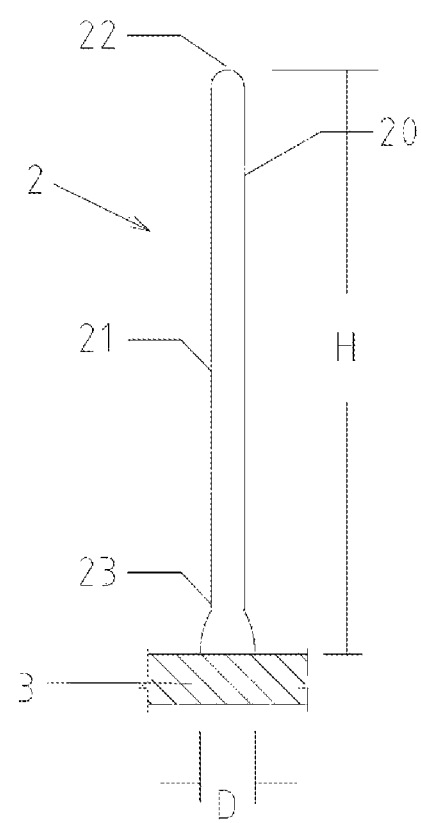
FIG. 5 shows a schematic cross-sectional view of a heat-wing in accordance with a second embodiment of the present invention.

A first embodiment of the present invention is shown in FIGS. 3 and 4. As illustrated, the heat-wing of the present invention includes a chamber 2 which is essentially a hollow plate-shaped structure including the first plate 20, the second plate 21 and a second portion 22 of the frame and a first portion 23 of the frame connecting the two plates (20 and 21). The heat-wing further includes a capillary structure layer 12 which is closely attached to an inner surface of the chamber 2, and a phase transition working medium 13 hermetically sealed in the chamber 2. The first outside surface portion of the frame 23 comes in contact with a heat source 3, and thus functions as an evaporation area, while the rest portion of the chamber 2 acts as a condensation area. Alternatively, it is also possible to use a portion of a periphery of one of the first plate 20 and the second plate 21 to serve as the evaporation area.

Each of a length and a height of the heat-wing is much greater than a thickness of the heat-wing. As a result, the heat-wing possesses a large passage area for vapor transport, ensuring high temperature uniformity. Additionally, since the gap between the two plates 21 (i.e., the thickness of the heat-wing) is very small, bringing a portion of a periphery of one plate 21 or the first outside surface portion of the frame 23, which has a limited area relative to the whole area of thin plate-shaped chamber 2, into direct contact with the heat source 3 so as to make it serve an evaporation area realizes a very short evaporator center-to-edge distance, thereby addressing the issue of early dry-out of the evaporation area central area. Moreover, by using the two relatively large plates of the chamber to serve as a condensation area, the heat-wing ensures a large condensation area, which facilitates heat dissipation and vapor condensation. In addition, this feature allows a larger passage width for the flow-back of the working medium 13 and hence increases the flux of the medium. For these reasons, the heat-wing has a greatly improved heat transfer limit and is hence capable of achieving a higher heat flux density.

Herein, the height of the heat-wing, i.e., the height of the hollow chamber 2, is defined as a dimension projecting away from a plane of the heat source, i.e., the height is a distance from a side of the two plates contacting the heat source 3 to the opposite side of the two plates which is farthest from the heat source 3. Therefore, for flat plates 20 and 21 (e.g., that shown in FIG. 8), the distance is the length of a straight line, and for curved plates 20 and 21 (e.g., those shown in FIGS. 4 to 7, and 11), the distance is the length of a curve. length of the heat-wing, i.e., the length of the hollow chamber 2, is defined as a dimension extending in parallel to the plane of the heat source.

The length, height and thickness of the heat-wing may vary with specific needs of different applications, but a common requirement for these dimensions is that both the length and height should be much greater than the thickness, e.g., at least one order of magnitude greater. The present invention is, however, not limited in this regard, because those skilled in the art may design suitable length, height and thickness for the heat-wing without departing from the spirit of the present invention, based on their knowledge.

Materials that the chamber 2 can be fabricated from include copper, aluminum, stainless steel and alloy thereof, high thermal conductivity ceramics, and other high thermal conductivity materials, each of which can ensure a good heat transfer performance of the heat-wing.

The capillary structure layer 12 may be a single- or multi-layer structure made of sintered powder(s), wire lattices, grooves etched into the chamber, fibers, coated or grown carbon nanowalls, carbon nanotubes or carbon nanocapsules, other coated or grown nano- or micro-order thin organic or inorganic layer(s), or any combination of the above, or any other suitable structure providing capillary attraction.

Materials that may be used as the working medium 13 sealed in the heat-wing include water and other liquids, low melting point metals, carbon nanocapsules, other nanoparticles, mixtures of the above materials, and other materials having gas-liquid phase change at a temperature within the operating temperature range of the heat-wing.

The heat-wing may be evacuated to a certain degree of vacuum, and may accordingly further include a support or connection structure (not shown) disposed between the first plate 20 and the second plate 21. The support or connection structure may be designed according to the mechanical strength of the chamber 2 and positive and negative pressures to be applied thereto. The support or connection structure may assume the shape of a dot, a line, a sheet or any other shape. Further, in some alternative embodiments in which the chamber 2 has a sufficient strength to sustain the required load, the heat-wing may not include the support or connection structure.

In the first embodiment, the two plates 20 and 21 are in parallel to each other except in their bottom sections, and a bottom section of the chamber 2 that is in close contact with the heat source 3 is thicker than an upper section of the heat-wing. In some alternative embodiments of the invention, the plates 20 and 21 are parallel to each other, or the chamber 2 may have different thicknesses in its top and bottom sections.

The heat-wing may further include auxiliary features arranged on the plates, such as, for example, fin(s) (not shown), tube(s) for vacuuming and liquid filling (not shown) and the like. The fin(s) is capable of facilitating the dissipation of heat from the interior of the heat-wing. In addition, for a better heat transfer performance, the heat-wing and/or the Min(s) can be coated with a black-body radiator material in order to further promote heat dissipation from the interior of the heat-wing and fin(s). The tube(s) can be used in creating a desired vacuum condition for the working medium in the heat-wing. It is to be noted that the heat-wing may not include the fin(s) and tube(s) in some alternative embodiments.

Heat-wings constructed in accordance with second to sixth embodiments of the invention are respectively shown in FIGS. 5 to 9. As demonstrated in FIGS. 5 to 7, the heat-wing of the present invention may have different cross-sectional shapes of a bottom section thereof, such as, a convex arc shape of a bottom section of the plates 20 and 21 proximal to the evaporation area shown in FIG. 5, a concave arc shape shown in FIG. 6, and a substantially rectangular shape shown in FIG. 7. In addition, the first outside surface portion of the frame 23 of the chamber may be slightly thicker than the second outside surface portion of the frame 22 of the heat-wing. Alternatively, it can be appreciated that the first outside surface portion of the frame 23 of the heat-wing may also have a thickness the same or smaller than that of the second outside surface portion of the frame 22 of the heat-wing.

Figure 6:
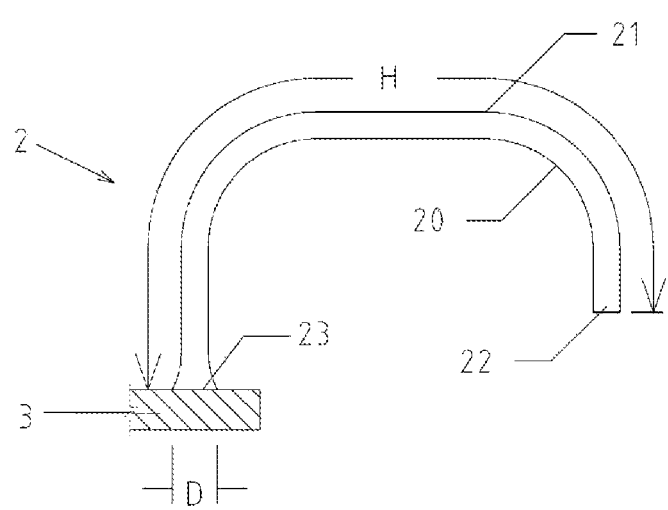
FIG. 6 shows a schematic cross-sectional view of a heat-wing in accordance with a third embodiment of the present invention.
Figure 7:
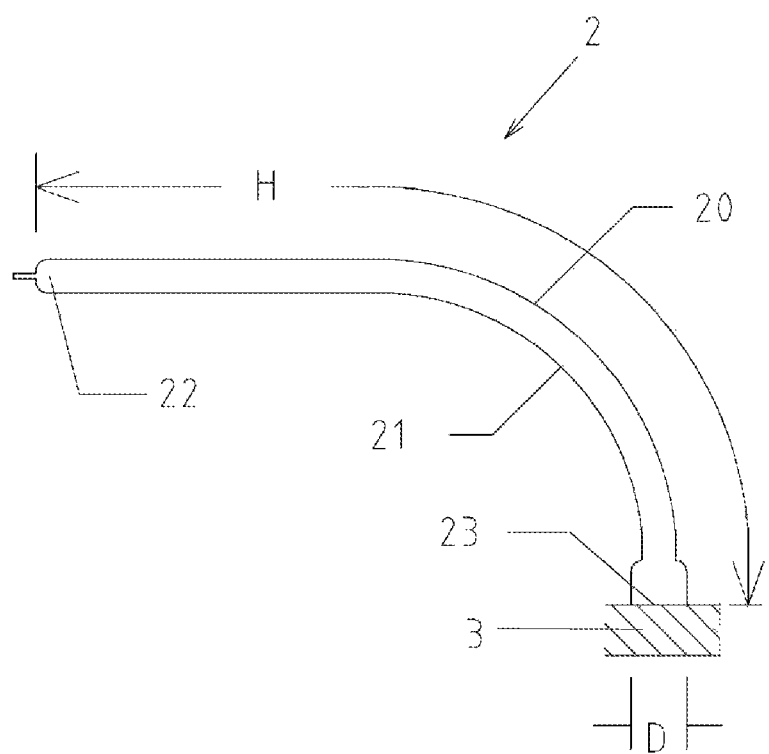
FIG. 7 shows a schematic cross-sectional view of a heat-wing in accordance with a fourth embodiment of the present invention.
Figure 8:
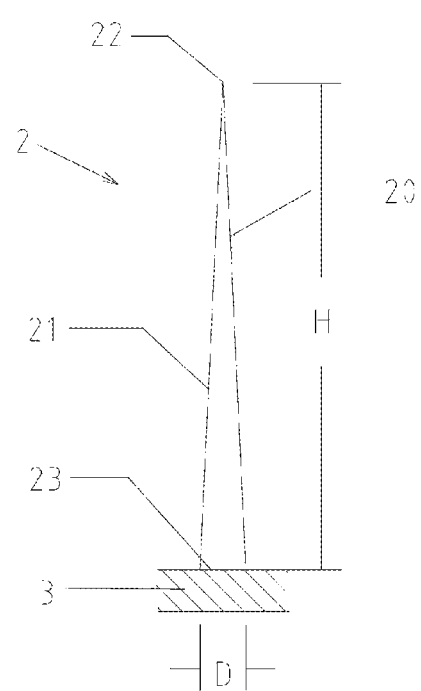
FIG. 8 shows a schematic cross-sectional view of a heat-wing in accordance with a fifth embodiment of the present invention.
Figure 9:
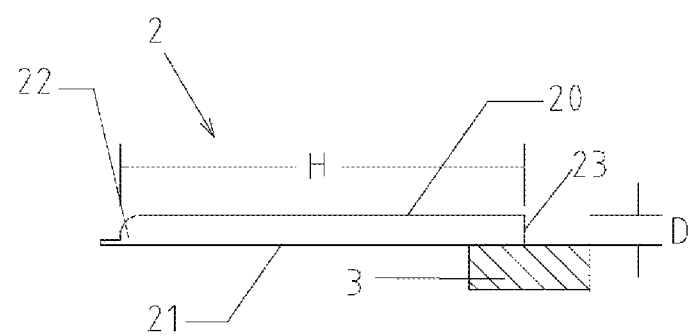
FIG. 9 shows a schematic cross-sectional view of a heat-wing in accordance with a sixth embodiment of the present invention.

As demonstrated in FIGS. 4 to 9, the frame of the heat-wing may either include a first portion of the frame 23 and a second portion of the frame 22 (as shown in FIGS. 4 to 7, and 9), or only includes the first outside surface portion of the frame 23, the second outside surface portion of the frame does not exist or partially does not exist (as shown in FIG. 8). In the latter case, the hollow chamber may be closed at the top by directly connecting top portions of the two plates 20 and 21. Further, as shown in FIGS. 4 to 7, and 9, the second outside surface portion of the frame 22 may be closed by different techniques and thus have different shapes, such as, for example, an arc shape shown in FIG. 5, a linear shape shown in FIG. 6, and a shape with a protrusion which may be formed at different positions as shown in FIGS. 7 and 9.

As demonstrated in FIGS. 5 to 9, and 11, the heat-wing may have a variety of overall shapes, such as, for example, the shape of a wedge as shown in FIG. 8 and the shapes with bent plates 20 and 21 as shown in FIGS. 6 and 7.

In addition, as demonstrated in FIG. 9, the heat-wing may have a portion of a periphery of two plates (20 and 21) being taken in contact with the heat source 3 to serve as the evaporation area.

Figure 11:
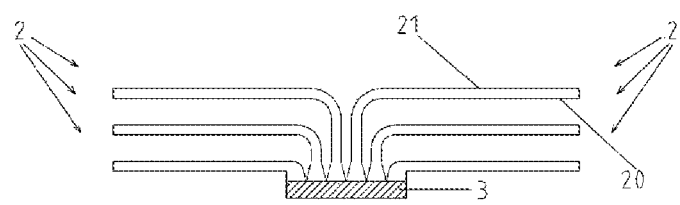
FIG. 11 shows a schematic cross-sectional view of a heat-wing array in accordance with an eighth embodiment of the present invention.

Further, as demonstrated in FIG. 11, the heat-wing may be bent to project laterally in response to a height limitation.

Figure 10:
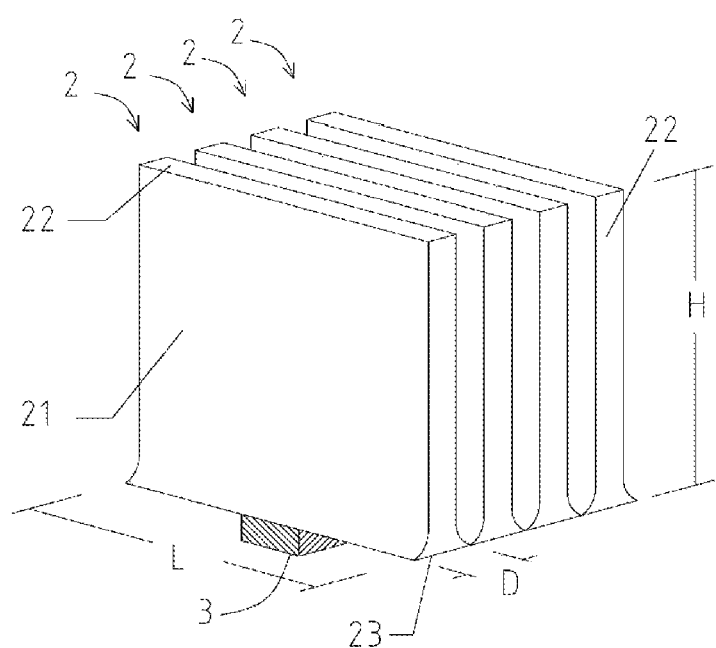
FIG. 10 shows a three-dimensional view of a heat-wing array in accordance with a seventh embodiment of the present invention.

FIG. 10 shows a seventh embodiment of the present invention. As illustrated, in this embodiment, a plurality of the heat-wings of FIG. 3 are arranged in an array and disposed on a heat source, totally covering the top surface of the heat source. Such array arrangement expands the two-dimensional phase-change heat transfer into a three-dimensional space and hence can achieve a higher heat flux density.

Figure 12:
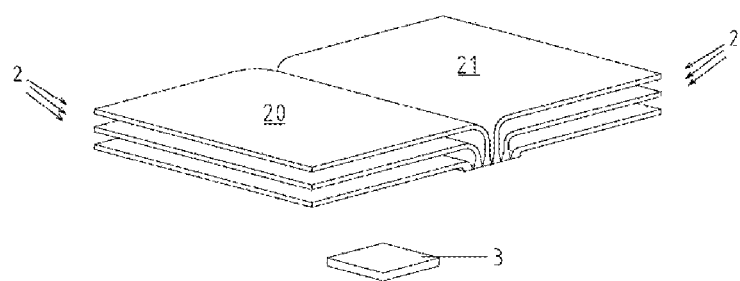
FIG. 12 is an exploded three-dimensional view of FIG. 11.

FIGS. 11 and 12 show an eighth embodiment of the present invention. As illustrated, in this embodiment, a plurality of the J-shaped heat-wings of FIG. 7 are arranged in an array and disposed on a heat source, totally covering the top surface of the heat source. Differing from the seventh embodiment, each heat-wing of the array of this embodiment is bent to project laterally from the heat source and is thus particularly suitable for applications where there exists a height limitation.

Figure 13:
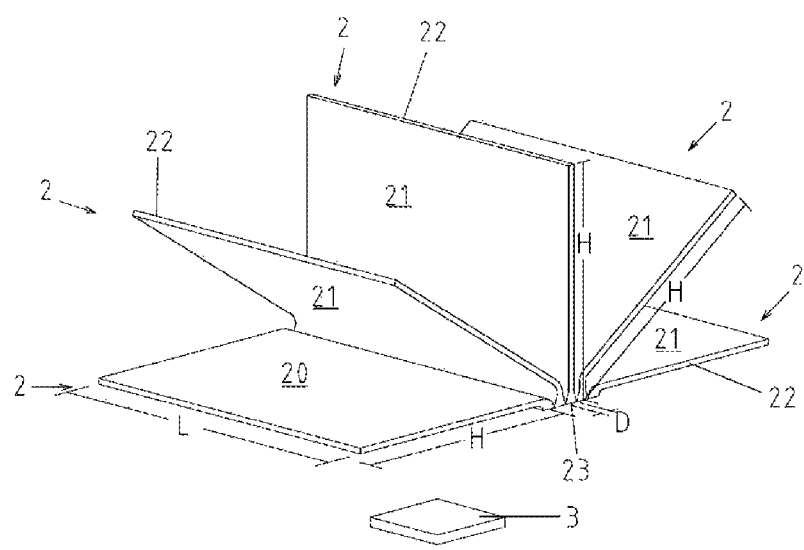
FIG. 13 shows a three-dimensional view of a heat-wing array in accordance with a ninth embodiment of the present invention.

FIG. 13 shows a three-dimensional view of a heat-wing array in accordance with a ninth embodiment of the present invention.

Figure 14:
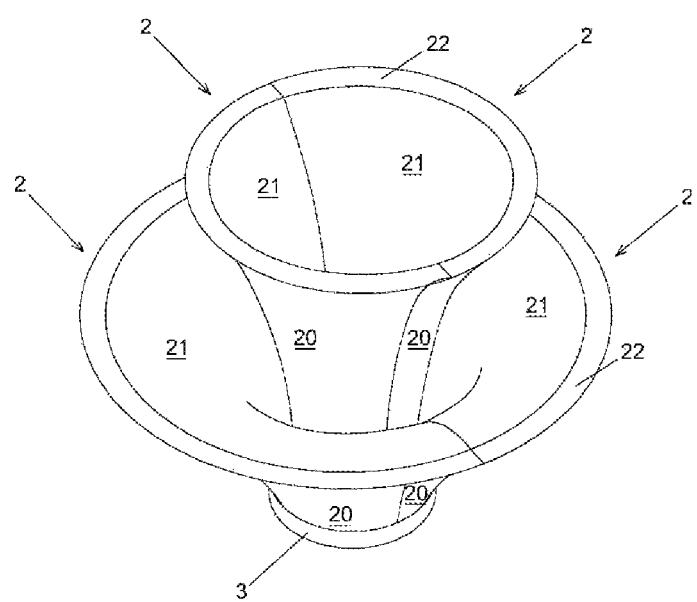
FIG. 14 shows a three-dimensional view of a heat-wing assembled array in accordance with a tenth embodiment of the present invention.
Figure 15:
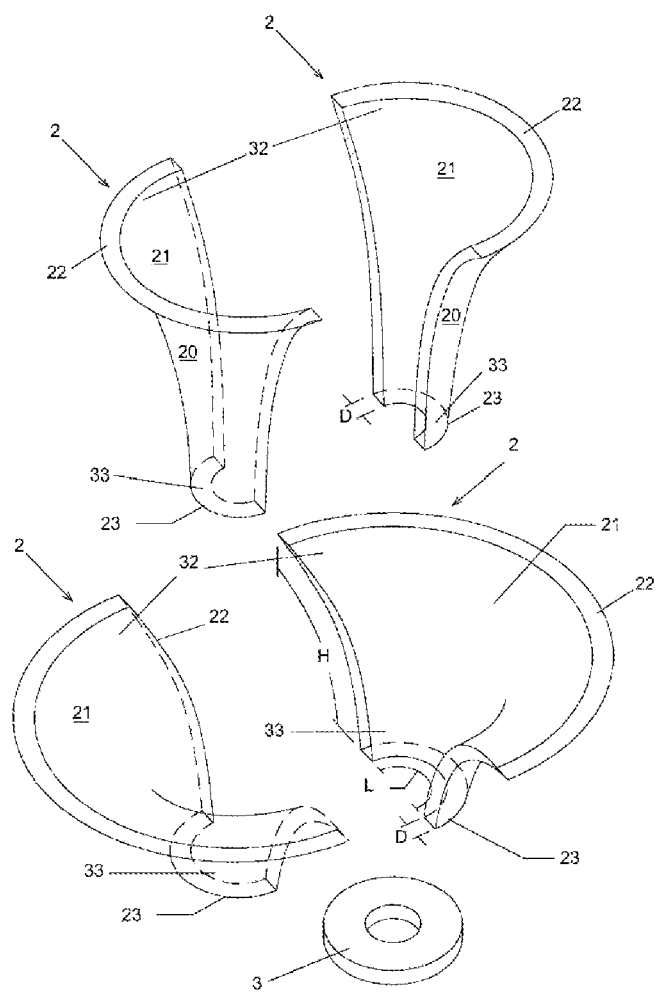
FIG. 15 is an exploded perspective view of FIG. 14

FIG. 14 shows a three-dimensional view of a heat-wing assembled array in accordance with a tenth embodiment of the present invention. FIG. 15 is an exploded perspective view of FIG. 14

Figure 1:
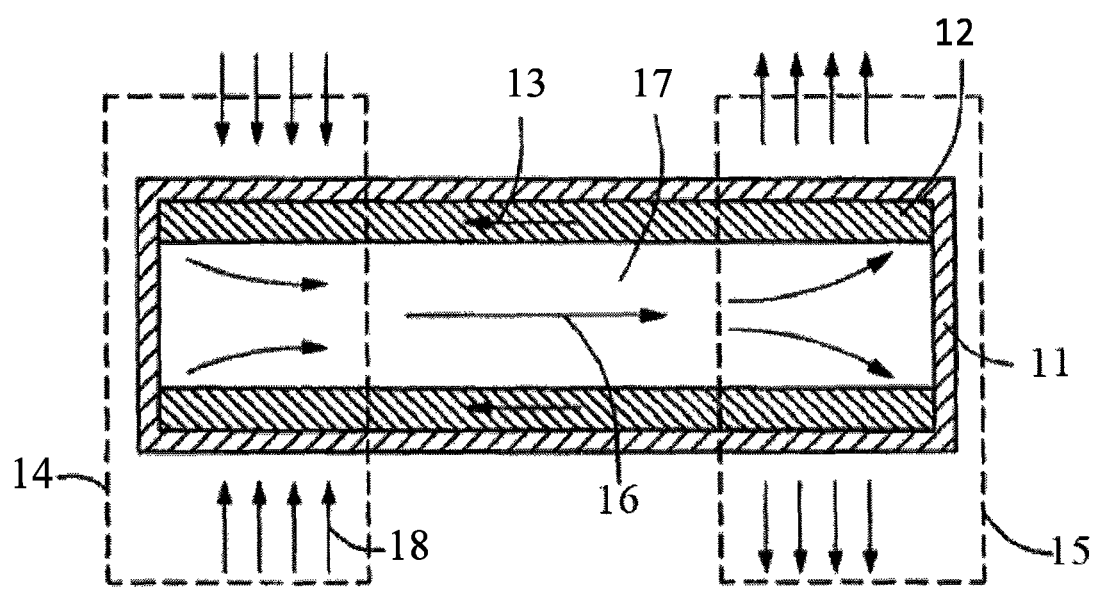
FIG. 1 shows a schematic cross-section view of a conventional heat pipe.
Figure 2:
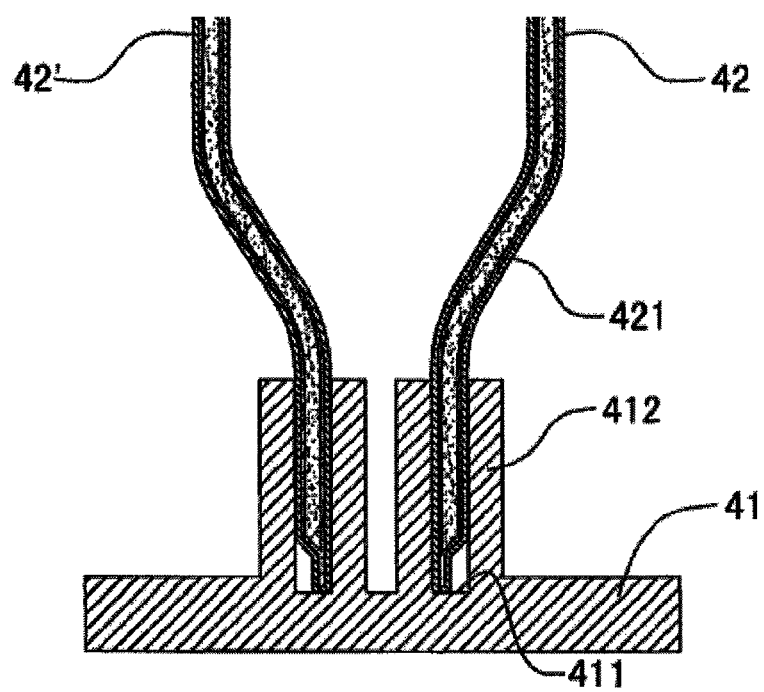
FIG. 2 shows a schematic cross-section view of a conventional vapor chamber.

In FIG. 14 and FIG. 15, 2 is heat wing. 3 is a heat source. L is the length of the first outside surface portion of the frame. H is the height of the chamber. D is the thickness of the chamber. 20 is the first plate and 21 is the second plate. The first end 33 of the chamber is the end of the chamber where the first outer surface portion of the frame is located, the second end 32 of the chamber is the other end of the chamber where the second outer surface portion of the frame is located. The height and the length thereof are the height and the length of this chamber before it is not bent; and the thickness of this chamber is the width of the first outside surface portion of the frame.

In FIG. 14 and FIG. 15, it is shown four heat wings which are curved in the direction of the length and height. They can be used on and are not only used on a heat source of a circle-shape or an annulus-shape planar surface. In some other illustrative embodiments, one or a few heat wings can be disposed at the same time. If it is technically necessary, the curved annulus-shape heat wing can be spliced together by several parts. In FIG. 14 and FIG. 15, it is shown two annulus-shape ones are be spliced together by four chambers.

In In some other illustrative embodiments, single part or several parts of annulus shape can be disposed.

In In some other illustrative embodiments, the chamber thereof can be bent or not.

The heat wing shown in FIG. 14 and FIG. 15 has the same first portion of the narrow and elongated frame, a large-area vapor passage and a large-area plates of condensation zone; and it is accordance with the designing rule of the heat wing.

Figure 16:
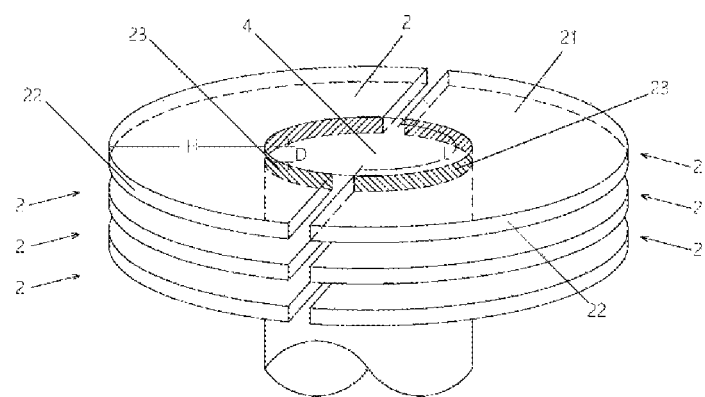
FIG. 16 shows a three-dimensional view of a heat-wing assembled array in accordance with a eleventh embodiment of the present invention.

FIG. 16 shows a three-dimensional view of a heat-wing assembled array in accordance with a eleventh embodiment of the present invention.

In FIG. 16, it indicates heat wings of an annulus shape or a part of annulus shape. They can be used and are not only used on a heat source of a cylinder-shape or other curved surface.

In FIG. 16, 4 is a heat source of cylinder shape. 2 is heat wings. 20 and 21 are plates of the heat wing. 23 is the first outside surface portion of the frame, i.e. the inner arc length of the chamber. 22 is the second outside surface portion of the frame. H is the width of the annulus, i.e. the height of the chamber. L is the length of the first outside surface portion of the frame. D is the width of the first outside surface portion of the frame.

In FIG. 16, the heat wing shown can be assembled and arrayed on a heat source in the manner a single or a plurality of heat wings and it is configured as a part of the body of the heat-generating device, i.e. the first portion of the heat wing's frame is the part of the body of the heat-generating device.

Figure 17:
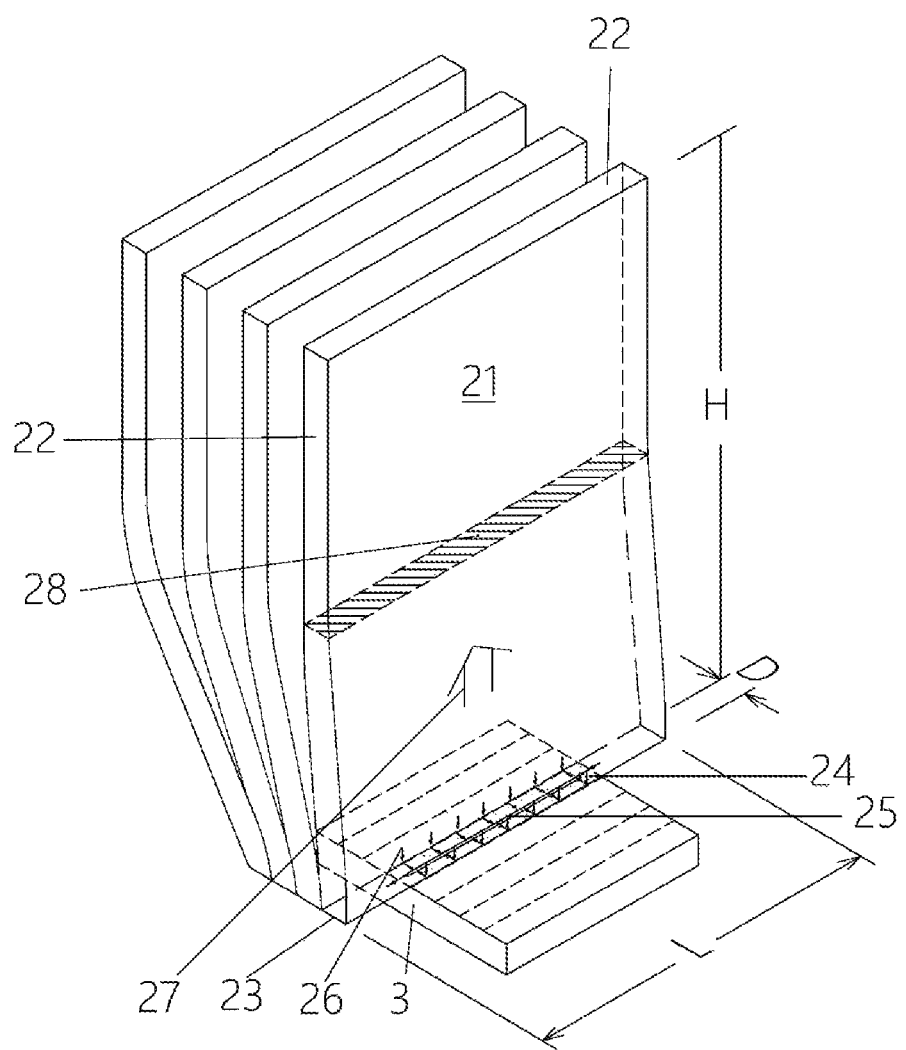
FIG. 17 shows working-principle view.

FIG. 17 shows working-principle view. In FIG. 17, 3 is a heat source. 20 and 21 are plates of a chamber. 22 is the second outside surface portion of the frame. 23 is the first outside surface portion of the frame. 24 is the evaporation zone. 25 is the center of the evaporation zone. 26 is the direction of the liquid to the evaporation zone. 27 is the direction of vapor diffusion. 28 is the section of vapor passage. L is the length of the first outside surface portion of the frame. H is the chamber's height. D is the thickness of the chamber and is also the width of the first outside surface portion of the frame.

Figure 18:
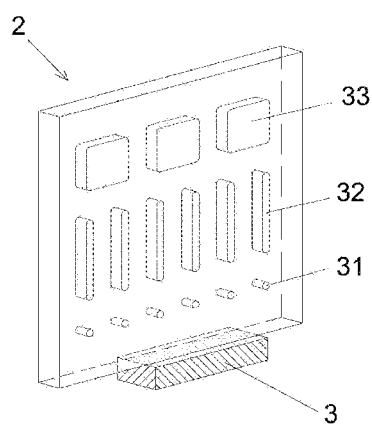
FIG. 18 shows the structural view of inner supporting of the heat wing.

Seen from the figure, compared with the conventional, the heat wing uses the narrow and flat frame as the evaporation zone and uses very large plates as the condensation zone so that there is huge increase in the width of the transportation of the liquid, tremendous increase in the ratio that the cross section of vapor passages to the area of evaporation zone, huge decrease in the distance from the edge to the center of the evaporation zone and significant increase in the ratio of the area of the condensation zone to the evaporation zone. Thus, this increases the heat transfer efficiency in order of magnitude. FIG. 18 shows the structural view of inner supporting of the heat wing. Wherein, 2 is heat wing. 3 is heat source. 31 is the dot-shape supporting. 32 is the line-shape supporting. 33 is the piece-shape supporting.

It is to be understood that changes and modifications may be made by those having ordinary skill in the art after reviewing the above description. It is therefore intended that the appended claims cover all such changes and modifications that are within the scope of the claimed subject matter.

INDUSTRIAL APPLICABILITY

The application of the present invention in industries can not only greatly reduce the dimension and height of heat dissipation apparatuses but also highly improve the heat flux density of heat dissipation apparatuses.

Heat dissipation apparatuses incorporating the heat-wing(s) can be used for the heat dissipation of high-power semiconductor devices like high-power transistors, high-power semiconductor laser devices, high-power light emitting diodes (LEDs), high-power central processing units (CPUs), high-power graphics processing units (GPUs) and so on.

In occasions where heat dissipation apparatuses incorporating the heat-wing(s) is used, all water cooling methods can be replaced by air cooling methods, and active cooling methods can be replaced by passive cooling methods.

Heat dissipation apparatuses incorporating the heat-wing(s) can enable the reduction of height of a tower case of a desktop computer to nearly a thickness of a laptop computer.

What is claimed is:

1. A heat-wing comprising:
   a plate-shaped chamber formed by a first plate spaced from a second plate forming a condensation area having a length and a height, the first plate and the second plate connected together by a frame, the frame forming an evaporation area on a first end of the chamber between a first end of the first plate and a first end of the second plate, the evaporation area having a thickness defined as a distance between the first plate and the second plate, and an evaporation length defined as a length of the evaporation area, the evaporation length of the evaporation area within the chamber being greater than the thickness of the evaporation area by at least an order of magnitude, the frame sealing the first plate to the second plate thereby forming a sealed chamber having an enclosed and hollow space defined by the chamber on an inside of the first plate, the second plate, and the frame;

a capillary structure layer within the chamber and adjacent inner surfaces of at least a part of the first plate and the second plate, the capillary structure layer further attached to an inner surface of at least a part of the frame; and a phase transition working medium sealed within the sealed chamber, the sealed chamber being evacuated;

wherein the evaporation area is configured to be coupled with the evaporation length and its thickness in direct, planar, physical contact with a heat source; and wherein the condensation is configured to not be in direct physical contact with the heat source, and is configured to extend away from the heat source.

2. The heat-wing of claim 1, wherein the chamber extends away from a surface of the heat source with a perpendicular angle.

3. The heat-wing of claim 1, wherein the chamber extends away from a surface of the heat source with a parallel angle.

4. The heat-wing of claim 1, wherein the chamber extends away from a surface of the heat source with a tilted angle.

5. The heat-wing of claim 1, further comprising a first outside surface portion of the frame that is planar and configured to directly contact a planar surface of the heat source.

6. The heat-wing of claim 1, further comprising a first outside surface portion of the frame that is shaped as a curved planar surface and configured to directly contacting a corresponding curved planar surface of the heat source.

7. The heat-wing of claim 1, wherein the first plate and the second plate are parallel planar surfaces.

8. The heat-wing of claim 1, wherein the first plate and the second plate are curved surfaces.

9. The heat-wing of claim 1, wherein:

each of the first plate and the second plate are hyperboloid-shaped;

the first plate and the second plate are hyperboloid surfaces;

a cross section of the chamber is curve-shaped and includes a gap between adjacent surfaces of the first plate and the second plate;

a first outside surface portion of the frame is curve-shaped on a first end of the chamber; and a second outside surface portion of the frame is curve-shaped on a second end of the chamber.

10. The heat-wing of claim 9, wherein the first outside surface portion on the first end of the chamber is curve-shaped for directly contacting the heat source being of corresponding shape.

11. The heat-wing of claim 1, wherein:

each of the first plate and the second plate have are annulus-shaped;

a first outside surface portion of the frame is a first column connecting inner circles of the first plate and the second plate; and a second outside surface portion of the frame is a second column connecting outer circles of the first plate and the second plate.

12. The heat-wing of claim 11, wherein the first outside surface portion of the frame is for directly contacting the heat source being of corresponding column shape.

13. A heat-wing assembly, comprising a plurality of heat-wings of claim 1 for mounting in direct, physical contact with a single heat source.

14. The heat-wing assembly of claim 13, wherein each of the plurality of heat-wings is hyperboloid and at least an inside heat-wing is surrounded by an outside heat-wing, each of the heat-wings having the first outside surface portion of the frame for contact with a heat source.

15. The heat-wing assembly of claim 13, wherein each of the plurality of heat-wings is annulus-shaped having an inner circle for contact with a column-shaped heat source.

16. The heat-wing assembly of claim 13, wherein each of the plurality of heat-wings is fabricated as a portion of a heat source device, the first outer surface portion of the frame is configured as a portion of the heat source.

17. A heat-wing comprising:

a chamber formed by a first condensation plate and a second condensation plate, the first condensation plate and the second condensation plate each having a length and a height and being positioned adjacent to each other, a first end of the first condensation plate and a first end of the second condensation plate are joined together by an evaporation area having a thickness extending between the first and second condensation plates along their respective lengths, the lengths of the respective first and second condensation plates defining the evaporation area within the chamber being greater than the thickness of the evaporation area by at least one order of magnitude, wherein other edges of the respective first and second condensation plates are joined together by chamber sides to form an evacuated, sealed, hollow chamber between the first and second condensation plates;

a capillary structure layer and attached to the evaporation area within the chamber; and a phase transition working medium sealed within the chamber;

wherein the evaporation area is configured to be coupled with its length and thickness in direct, planar, physical contact with a heat source at an area with a corresponding heat source length and thickness.

* * * * *